(12) United States Patent
Wei

(10) Patent No.: US 8,542,786 B2
(45) Date of Patent: Sep. 24, 2013

(54) MULTI-CHANNEL SAMPLE RATE CONVERTER

(75) Inventor: Jeff Wei, Richmond Hill (CA)

(73) Assignee: Evertz Microsystems Ltd., Burlington (CA)

( * ) Notice: Subject to any disclaimer, the term of this patent is extended or adjusted under 35 U.S.C. 154(b) by 255 days.

(21) Appl. No.: 12/850,162

(22) Filed: Aug. 4, 2010

(65) Prior Publication Data

US 2012/0033771 A1    Feb. 9, 2012

(51) Int. Cl.
*H04L 7/00* (2006.01)

(52) U.S. Cl.
USPC .......................................................... 375/355

(58) Field of Classification Search
USPC .......................................................... 375/355
See application file for complete search history.

(56) References Cited

U.S. PATENT DOCUMENTS

| 4,536,745 | A  | * | 8/1985  | Yamaguchi et al. ............ 341/61  |
| 5,155,743 | A  | * | 10/1992 | Jacobs .......................... 375/247 |
| 5,982,305 | A  | * | 11/1999 | Taylor ............................. 341/61 |
| 6,462,682 | B2 | * | 10/2002 | Hellberg ......................... 341/61 |
| 6,531,975 | B1 | * | 3/2003  | Trotter et al. ................. 341/144 |
| 6,766,338 | B1 | * | 7/2004  | Handley et al. ............... 708/313 |
| 7,126,505 | B2 | * | 10/2006 | Avantaggiati ................... 341/61 |
| 7,280,878 | B1 | * | 10/2007 | Rossum .......................... 700/94 |
| 2004/0263363 | A1 | * | 12/2004 | Biswas .......................... 341/61 |
| 2009/0319065 | A1 | * | 12/2009 | Risbo ............................. 700/94 |
| 2011/0164663 | A1 | * | 7/2011  | Safiri ............................ 375/219 |
| 2011/0224996 | A1 | * | 9/2011  | Wang et al. ................... 704/503 |

\* cited by examiner

*Primary Examiner* — Juan A Torres
(74) *Attorney, Agent, or Firm* — Bereskin & Parr LLP/S.E.N.C.R.L., s.r.l.

(57) ABSTRACT

A method of sample rate conversion and clock synchronization for multiple asynchronous input signals using a single processing core. A sample processing clock with a frequency equal to or higher than the input signal clock frequencies is provided. The clock period is divided into a number of time slots corresponding to the input signals. For each valid sample of an input signal, the core performs a first stage processing operation on the sample. Subsequently, for each required sample of an output signal, the core performs a second stage processing operation to generate the output sample.

8 Claims, 13 Drawing Sheets

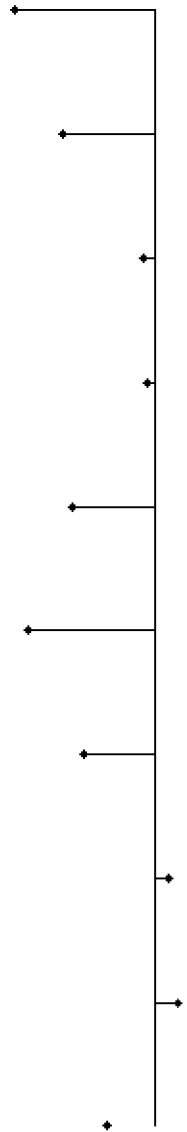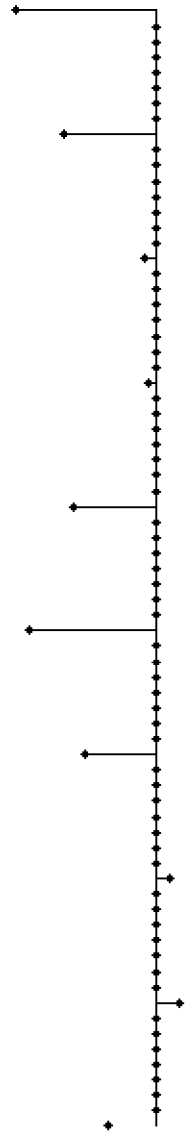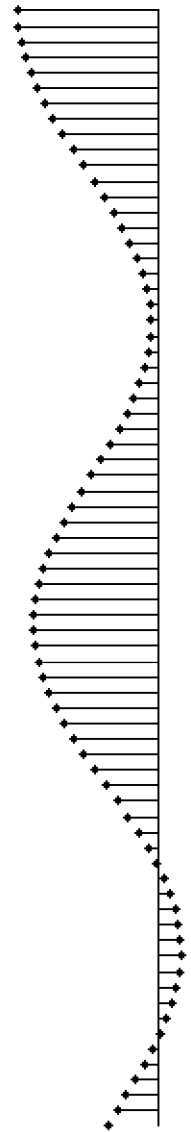
FIG. 1A
FIG. 1B
FIG. 1C (PRIOR ART)

US 8,542,786 B2

MULTI-CHANNEL SAMPLE RATE CONVERTER

FIELD

The described embodiments relate generally to the field of signal processing and, more particularly, to sample rate conversion of digital audio and video signals.

BACKGROUND

A characteristic of digital audio and video signals is the sampling rate, which is the number of samples per unit time (e.g., second) taken from a continuous signal to form a discrete signal. The concept of re-sampling digital signals, such as audio and video signals, to obtain a new sampling rate is well known. If the new sampling rate is higher than the original sampling rate, the re-sampling process is commonly referred to as upsampling. Conversely, if the new sampling rate is lower than the original sampling rate, the re-sampling process is commonly referred to as downsampling.

In some signal processing applications, it is desirable to synchronize multiple digital signals. To synchronize a given digital signal with respect to a reference signal, it is resampled such that the new sampling rate is equal to that of the reference signal, or some ratio thereof. At the same time, the timing of the resampled signal is matched to the reference signal.

For example, television broadcast signals typically have audio and video components, where the audio sampling rate is lower than the video sampling rate (e.g., 48 kHz audio and 27 MHz video). When generating the broadcast signal, if the source audio signal is not sampled at 48 kHz, or if the audio signal is not synchronized with the video signal clock, the audio signal is resampled to the desired 48 kHz sampling rate and locked to the video signal clock according to a 48/27000 ratio.

In another example, a digital audio router may switch tens or even hundreds of audio channels. To enable efficient switching, it is desirable for each audio channel signal to be synchronized to a reference sample rate by resampling.

SUMMARY

In a broad aspect, there is provided a method of sample rate conversion for at least one input signal, each at least one input signal having a plurality of input samples, the method comprising receiving the at least one input signal; generating an intermediate signal with an intermediate clock rate that is higher than or equal to each at least one input signal; providing N channels in the intermediate signal, wherein N is an integer value corresponding to the number of input signals, and wherein each of the N channels corresponds to one and only one input signal; for each at least one input signal, processing each of the plurality of input samples in the at least one input signal to produce a plurality of intermediate samples for the corresponding channel; providing an output reference clock signal; and generating N output signals synchronized to the output reference clock signal, each output signal corresponding to one channel in the intermediate signal, wherein each output signal is generated by filtering the plurality of intermediate samples corresponding to each channel to produce a plurality of output samples in the corresponding output signal.

Processing the plurality of input samples may comprise at least one first stage of filtering of the plurality of input samples. The at least one first stage of filtering may comprise interpolation between the plurality of input samples. The at least one first stage of filtering may comprise upsampling the plurality of input samples.

Filtering the plurality of intermediate samples may comprise interpolation between the plurality of intermediate samples. Filtering the plurality of intermediate samples may comprise upsampling the plurality of intermediate samples.

The at least one input signal may comprise a plurality of input signals, and the N channels in the intermediate signal may be provided by multiplexing the intermediate signal to accommodate the plurality of input signals. The multiplexing may comprise dividing each clock period of the intermediate signal into N time slots.

Prior to the processing each of the plurality of input samples in the at least one input signal, each of the input samples may be matched to a corresponding period of the intermediate signal based on a predetermined transition in a clock associated with the at least one input signal.

Prior to the producing the plurality of output samples, each of the intermediate samples may be matched to a corresponding period of the output signal based on a predetermined transition in the output reference clock signal.

Further aspects and advantages of the embodiments described herein will appear from the following description taken together with the accompanying drawings.

BRIEF DESCRIPTION OF THE DRAWINGS

An exemplary embodiment will now be described in detail with reference to the drawings, in which:

FIG. 1A illustrates a series of data samples;

FIG. 1B illustrates the series of FIG. 1A with inserted samples;

FIG. 1C illustrates the series of FIG. 1B after filtering is applied;

Figure 2:
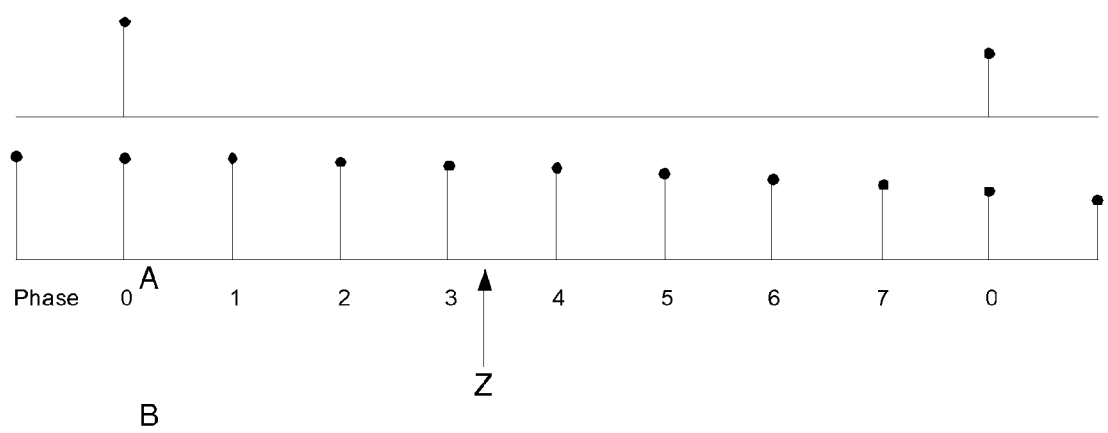
FIG. 2 illustrates an output sample point falling between samples of an upsampled signal.

The skilled person in the art will understand that the drawings, described below, are for illustration purposes only. The drawings are not intended to limit the scope of the applicant's teachings in any way. Further, where considered appropriate,

DESCRIPTION OF EXEMPLARY EMBODIMENTS

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

The embodiments described herein may be implemented in hardware or software, or a combination of both. Some embodiments are implemented in computer programs executing on programmable computers each comprising at least one processor and a data storage system (including volatile and non-volatile memory and/or storage elements). Program code is applied to input data to perform the functions described herein and generate output information. The output information is applied to one or more output devices, in known fashion.

Each program may be implemented in a high level procedural or object oriented programming and/or scripting language to communicate with a computer system. However, the programs can be implemented in assembly or machine language, if desired. In any case, the language may be a compiled or interpreted language. Each such computer program is preferably stored on a non-transitory storage media or a device (e.g. ROM or magnetic diskette) readable by a general or special purpose programmable computer, for configuring and operating the computer when the storage media or device is read by the computer to perform the procedures described herein. The inventive system may also be considered to be implemented as a computer-readable storage medium, configured with a computer program, where the storage medium so configured causes a computer to operate in a specific and predefined manner to perform the functions described herein.

In the field of signal processing, a straightforward method for synchronizing multiple channels of digitally sampled signal data involves converting each of the digital input signals to analog form and sampling the analog signals at the desired output sampling rate. However, this straightforward approach is often undesirable due to the expense of the high quality digital to analog converters (DACs) and analog to digital converters (ADCs) that are required. Further, this approach is also susceptible to noise contamination, thus requiring shielding of the intermediate analog signal. Accordingly, fully digital sample rate conversion is used more frequently.

Digital upsampling is the computational process of resampling a signal to increase the number of signal samples for a given time range of a signal, such as audio or video. The upsampling ratio may be defined as L, which is the ratio of the new upsampled sample rate over the previous sample rate.

Referring now to FIGS. 1A to 1C, there are shown time axes with a series of data samples represented as dots. FIG. 1A illustrates ten data samples of an original digital signal with a sampling rate of Fs. To upsample the original digital signal to a new sample rate that is eight times higher (i.e., according to an upsampling ratio of L=8), seven samples (i.e., L−1=7) must be inserted between the original samples at each new sampling point. The inserted samples may simply be zeros. FIG. 1B illustrates the same digital signal at the new sampling rate with L−1=7 zeros inserted between the original sample points.

Due to the insertion of zeros, the upsampled signal will not correspond to the original signal. To generate a corresponding upsampled signal, a filter may be applied. FIG. 1C illustrates the digital signal after an interpolation filter has been applied. The interpolation filter may be a lowpass filter with cutoff at Fs/2L. Accordingly, the output signal illustrated in FIG. 1C represents the original signal resampled at a sample rate of L*Fs, following the insertion of L−1 zeros between every pair of original samples and application of a lowpass filter.

Theoretically, as the upsampling ratio approaches infinity, the output digital signal converges to the analog signal. In this scenario, any output sample points can be selected to generate another resampled signal at a new sampling rate. However, in practice, the upsampling ratio L is finite and consequently an arbitrarily selected output sample point may fall in a position that is between 2 upsampled points.

Referring now to FIG. 2, there is provided an exemplary time diagram illustrating two original input data samples on axis A, an upsampled intermediate signal with L=8 on axis B and an output sample point for a new output signal labeled with arrow Z.

For each input data sample, there is a corresponding sample in the upsampled intermediate signal. Each corresponding sample in the upsampled intermediate signal has a phase offset of 0 relative to the original sample. Upsampled data points that do not correspond an original data point have a corresponding phase offset, shown here as an integer factor between 1 and L−1=7. The total number of phase offsets, including zero phase offset is equal to the upsampling ratio L. Viewed another way, there are L phase offsets repeating at the same rate as the original sample rate and all samples with phase 0 correspond to the sample positions of the original samples.

Upsampling increases the number of available sample points. However, in some cases, such as when synchronizing signals, it may be necessary to obtain an output sample point that falls between even the additional sample points available in the upsampled intermediate signal. For example, in FIG. 2, arrow Z illustrates an output sampling position that falls between the intermediate samples with phase 3 and phase 4. Arrow Z indicates an output sampling position with a phase of 3.33.

In a rudimentary approach, the output sample value may be chosen simply by rounding the phase position to an integer value and choosing the corresponding sample point. For example, in the example of FIG. 2, 3.33 would be rounded to 3 and the sample with a phase offset of 3 would be chosen.

Alternatively, both neighboring sample points may be chosen and linear interpolation performed to compute an output value.

For higher quality results, more than two neighbouring samples may be chosen and interpolation and/or line-fitting performed using those samples, to generate an output value that is closer to the value that would be obtained with the equivalent analog signal.

As noted above, interpolation may be achieved through the use of a lowpass filter. In one embodiment, the lowpass filtering may be performed by convolving a finite impulse response (FIR) filter kernel with the zero-inserted, upsampled signal as illustrated in FIG. 1B.

Figure 3A:
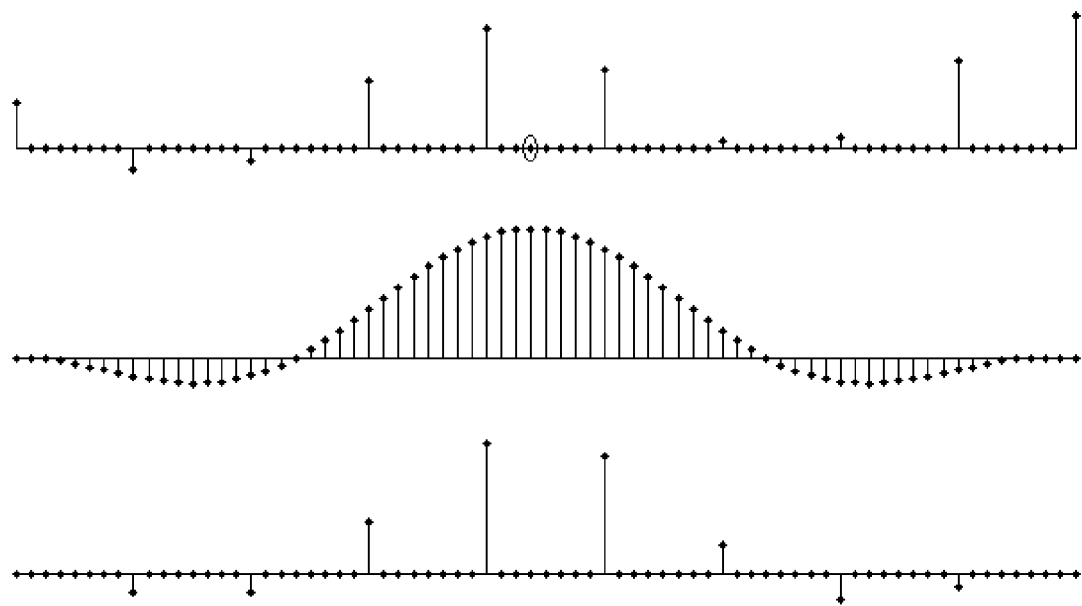
FIGS. 3A and 3B illustrate an exemplary filtering calculation.

Referring now to FIG. 3A, there are illustrated three data series for illustrating the results of multiplication in a FIR calculation. This first row shows a series of samples with zeroes inserted between the original samples. The second row shows the inverse sequence of a full FIR filter, which is centered to line up with the circled sample in the first row. The third shows the multiplication results of the first row with the second row.

In the example of FIG. 3A, there are L−1 samples that are inserted zeros for every L samples. Accordingly, it is possible to exploit these zeros to reduce the number of required multiplications. For example, for the first row it is only necessary to perform up to N/(L+1) (using the integer portion of the result) multiplications to generate one output value.

For example, to generate the result for the circled sample in FIG. 3A (i.e., phase offset 3), the first row of upsampled, zeroed data is multiplied by the second row of reversed filter coefficients. Each row is multiplied one by one and the products are summed. For a filter of length N (i.e., having N filter coefficients), N multiplications are required to generate one output sample.

Figure 3B:
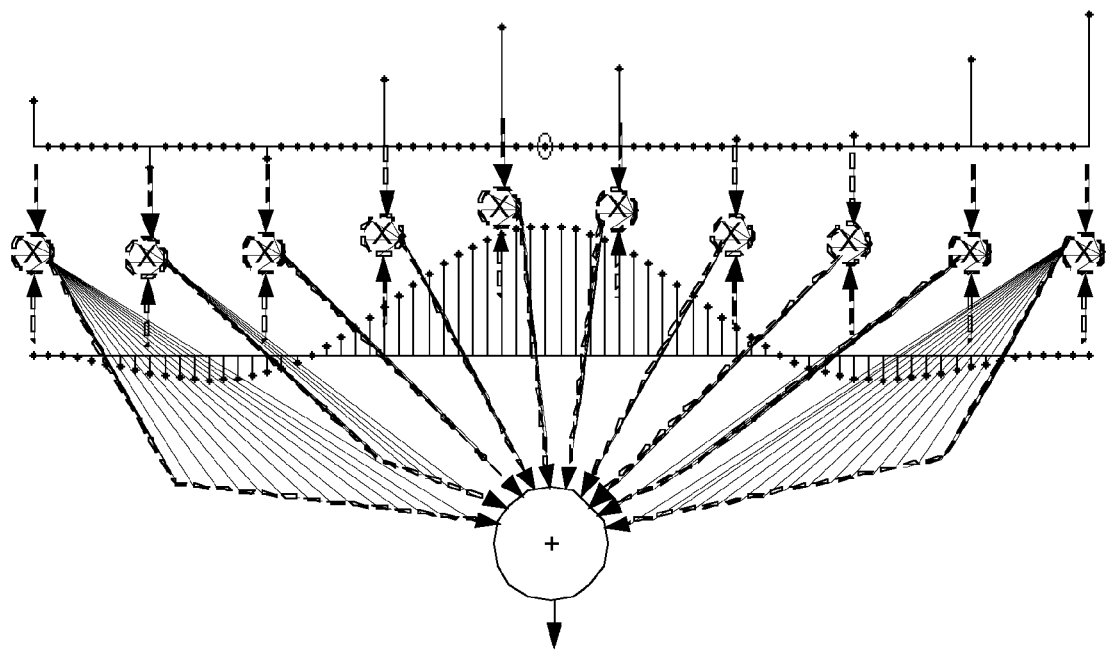

Referring now to FIG. 3B, there is illustrated a MAC procedure that may be performed to calculate an upsampled sample value corresponding to the circled zero in the first row. The first and second rows of FIG. 3B are the same as those shown in FIG. 3A. A total of L multipliers (X) and one adder (+) are shown to illustrate the factors and summands used to perform the multiply accumulator (MAC) calculation. It can be seen that each sample value in the first row is multiplied by a corresponding filter coefficient in the second row. The results of the multiplications are summed to produce a new upsampled sample value. The filter coefficients that are selected for multiplication are spaced L coefficients apart. These are the M coefficients that correspond to the phase of the circled sample.

In practice, instead of storing zero-inserted, upsampled signal values, only the original samples need to be stored and only N/(L+1) coefficients (again using only the integer portion of the result) may be selected to perform the computation. Accordingly, the N coefficients may be arranged into L phases, with each phase having M coefficients, where M is the integer portion of N/(L+1). The resulting output sample at phase P may be computed via multiplication and addition using the M coefficients that correspond to phase P. This type of filtering technique is commonly known as polyphase filtering.

In embodiments where the upsampling ratio L is large, the interpolation filter may require a narrow passband and a very narrow transition band. Correspondingly, this may result in the requirement for a very large number of filter coefficients, which in turn necessitates a large number of multiplication and accumulation operations to generate a single output value.

However, in practice, a multi-stage filter can significantly reduce the total number of required filter coefficients. A multi-stage filter takes advantage of the fact that each stage of lowpass filtering will provide overlapping stopband regions, which relaxes the transition band requirement for the subsequent stage.

Figure 4A:
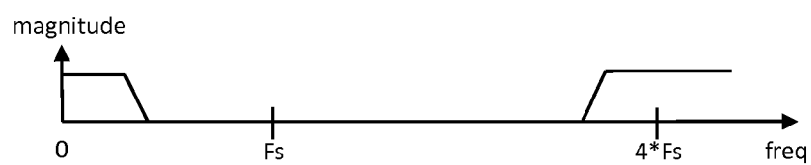
FIG. 4A illustrates an exemplary filter specification for a single stage upsampling filter.
Figure 4B:
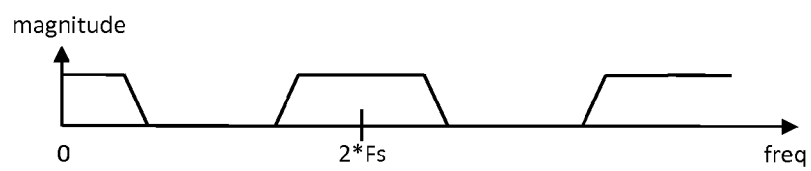
FIG. 4B illustrates the first stage of an exemplary two-stage upsampling filter.
Figure 4C:
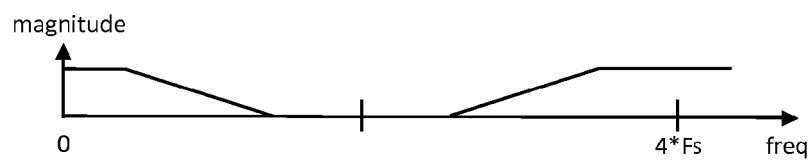
FIG. 4C illustrates the second stage of the exemplary filter of FIG. 4B.

Referring now to FIGS. 4A to 4C, there are shown frequency domain plots comparing the stopbands and transition bands for single-stage and multi-stage filters. FIG. 4A illustrates the filter specification for a single stage 4× upsampling filter. In contrast, FIGS. 4B and 4C illustrate the first and second stages of a two-stage 4× upsampling filter, respectively. In particular, the transition band of the second stage filter is considerably relaxed when compared to the single stage filter.

In general, filter length (e.g., the number of coefficients) is roughly proportional to the ratio of sampling rate to transition bandwidth. Accordingly, two-stage filtering requires less filter coefficients in total, when compared to a single-stage filter. This result also extends to the case of multi-stage filtering.

Digital resampling can be performed using programmable microcontrollers, FPGAs, ASICs or digital signal processors (DSPs). Another common method of synchronizing multiple channels involves providing multiple discrete sample rate converters (SRCs) in parallel. Suitable discrete SRC integrated circuits are offered by a number of vendors, including TI, ADI, Cirrus Logic, AKM, etc. Each discrete SRC converts one or more digital input signals. In variants where each discrete SRC may convert more than one digital input signal, the number of channels that a device can process is rather small (e.g., typically 2 or 4). An example of this method is described herein.

Figure 5:
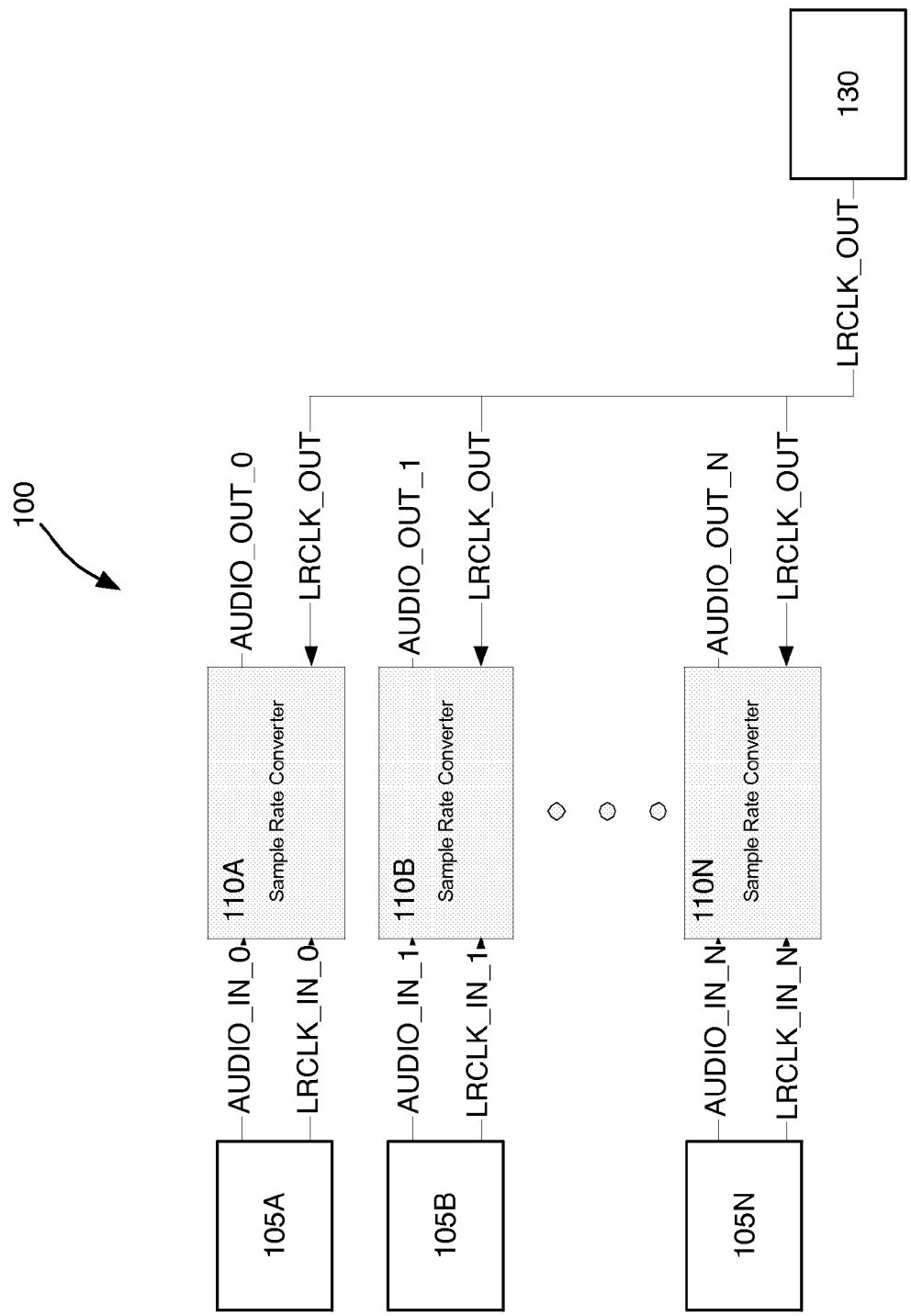
FIG. 5 is a schematic block diagram of a multi-channel audio sample rate converter.

Reference is made to FIG. 5, in which there is shown a block diagram of a known multi-channel audio sample rate converter 100. The sample rate converter 100 has a discrete sample rate converter dedicated to each input data source. In the illustrated embodiment, three discrete sample rate converters 110A, 110B and 110N are depicted corresponding to three input channels, each with a signal source 105A, 105B and 105N, respectively. Discrete sample rate converter 110A receives audio signal data AUDIO_IN_0 from signal source 105A, along with a reference clock signal LRCLK_IN_0 corresponding to signal AUDIO_IN_0. "LRCLK" is commonly known as the "left right clock" and is typically a square wave signal repeating at the sample rate of the audio signal.

Audio signal data AUDIO_IN_0 is typically 24-bit, 20-bit or 16-bit data in parallel or serial format. Input reference clock signal LRCLK_IN_0 is typically a square wave signal at the input signal sample rate, which is commonly selected from, or in the neighborhood of, 48 kHz, 44.1 kHz, 32 kHz, 96 kHz, 88.2 kHz, etc. Output reference clock signal LRCLK_OUT, which is provided by reference clock source 130, is typically a square wave signal at the desired output signal sample rate.

Although both the input and output reference clock signals may correspond to the same nominal sampling rate (e.g., 48 kHz), the clock signals may not be synchronized with respect to each other (e.g., "locked"). In some cases, the frequency of one sample rate may be faster or slower by a small amount, owing to differences in clock source or some other factor.

Figure 6:
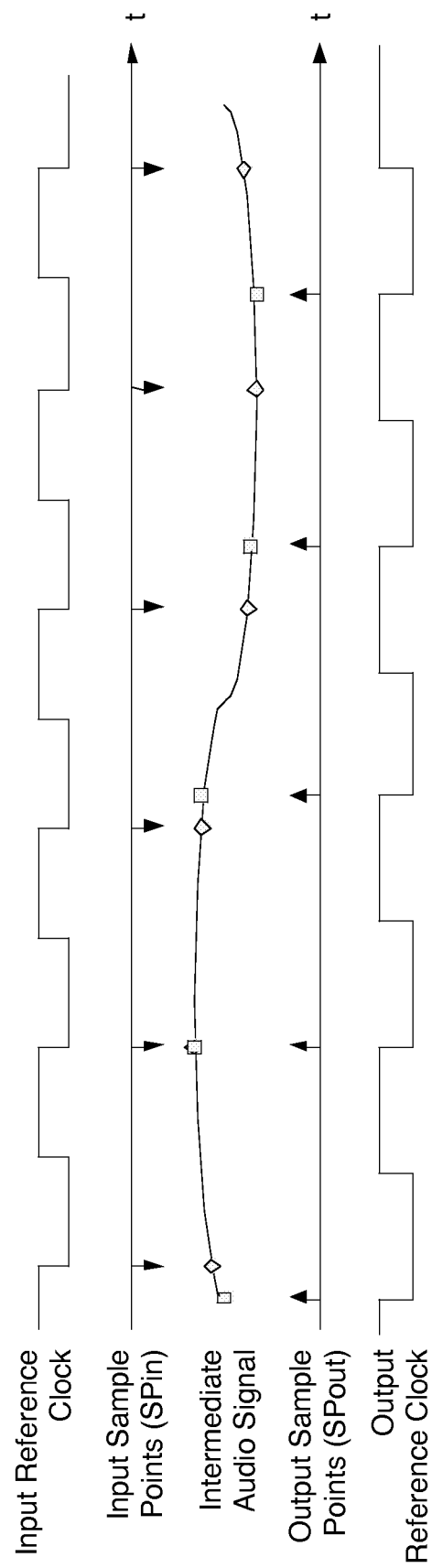
FIG. 6 is a time flow diagram showing sampling points for an exemplary sample rate converter.

Referring now to FIG. 6, there is shown a time flow diagram depicting signals and sampling points for an exemplary sample rate converter, such as discrete sample rate converter 110A. FIG. 6 illustrates the input reference clock signal LRCLK_IN_0, the output reference clock signal LRCLK_OUT, and input sample values (shown as diamonds) of the audio signal data AUDIO_IN_0, output sample values (shown as squares) and a representation of the analog data signal, which is line-fitted to the sample values. The signals and samples are shown on a time axis t. Also shown are downward arrows SPin, depicting the input sample points, and upward arrows SPout, depicting the output sample points.

In operation, SRC 110A receives input clock reference LRCLK_IN_0 and input signal AUDIO_IN_0 from signal source 105A. SRC 110A determines an input data sample from AUDIO_IN_0 at a predetermined point during the clock period of LRCLK_IN_0. For example, the predetermined point may be the falling edge of the clock signal.

Output sample points are determined in a similar manner to input sample points. For example, output sample points may be a predetermined point during the clock period of the output reference clock signal LRCLK_OUT. For each output sample point, SRC 110A generates a sample value for the audio data signal AUDIO_IN_0. In practice, output sample points may not correspond to input sample points. Accordingly, output sample values (shown as squares in FIG. 6) that occur at sample points without a corresponding input sample may be computed and generated according to known means.

The result of this approach is an output data signal that is synchronized with the desired sampling rate signal, LRCLK_OUT. By performing such resampling in parallel, multiple channels may be resampled and synchronized, subject to each SRC using the same output reference clock signal LRCLK_OUT.

Although the above approach is commonly used, this approach becomes more difficult to implement as the number of channels is increased; cost as well as circuit-board layout size are adversely affected by the requirement for a large number of channels. In particular, synchronization of output signals may require additional circuitry and complexity.

Accordingly, there is provided herein a sample rate converter that can process a large number of asynchronous digital signals using a logic core that is greatly reduced in size in comparison to the parallel discrete SRC approach.

In accordance with an exemplary embodiment, there is provided an integrated multi-channel sample rate converter (IMCSRC). The IMCSRC has a core processor that is used to process a plurality of input signal channels. The core processor provides an intermediate internal sampling signal, with an internal sampling rate or frequency that is pre-selected to be equal to or higher than that of the highest frequency input signal. The processor itself operates at a much higher frequency than the internal sampling rate in order to perform the necessary computation for each input signal during each clock period of the internal sampling signal. This high frequency enables the input signals to be time-multiplexed into a plurality of channels corresponding to the input signals such that, for each clock period of the internal sampling signal, the core processor is able to process a sample for all input channels.

To multiplex the input signals, a time slot generator periodically generates time slots for each input channel. For example, for four input channels, the time slot generator may divide the internal sampling signal into four time slots. Accordingly, for each period of the internal sampling signal, there may be four samples in the internal sampling signal, corresponding to each input signal.

As the internal sampling rate may exceed that of the input signal, a valid input sample value may not be available for each clock period of the internal sampling signal. Accordingly, an input flag generator monitors the input signal clocks and generates "valid" flags for each time slot that will contain valid samples. For each time slot in a given clock period of the internal sampling signal, the core processor determines if a valid input sample is available for the respective input signal and, if a valid input sample is available, the core processor may retrieve the sample and perform the signal processing required to generate an intermediate sample value or a valid output sample.

Figure 7:
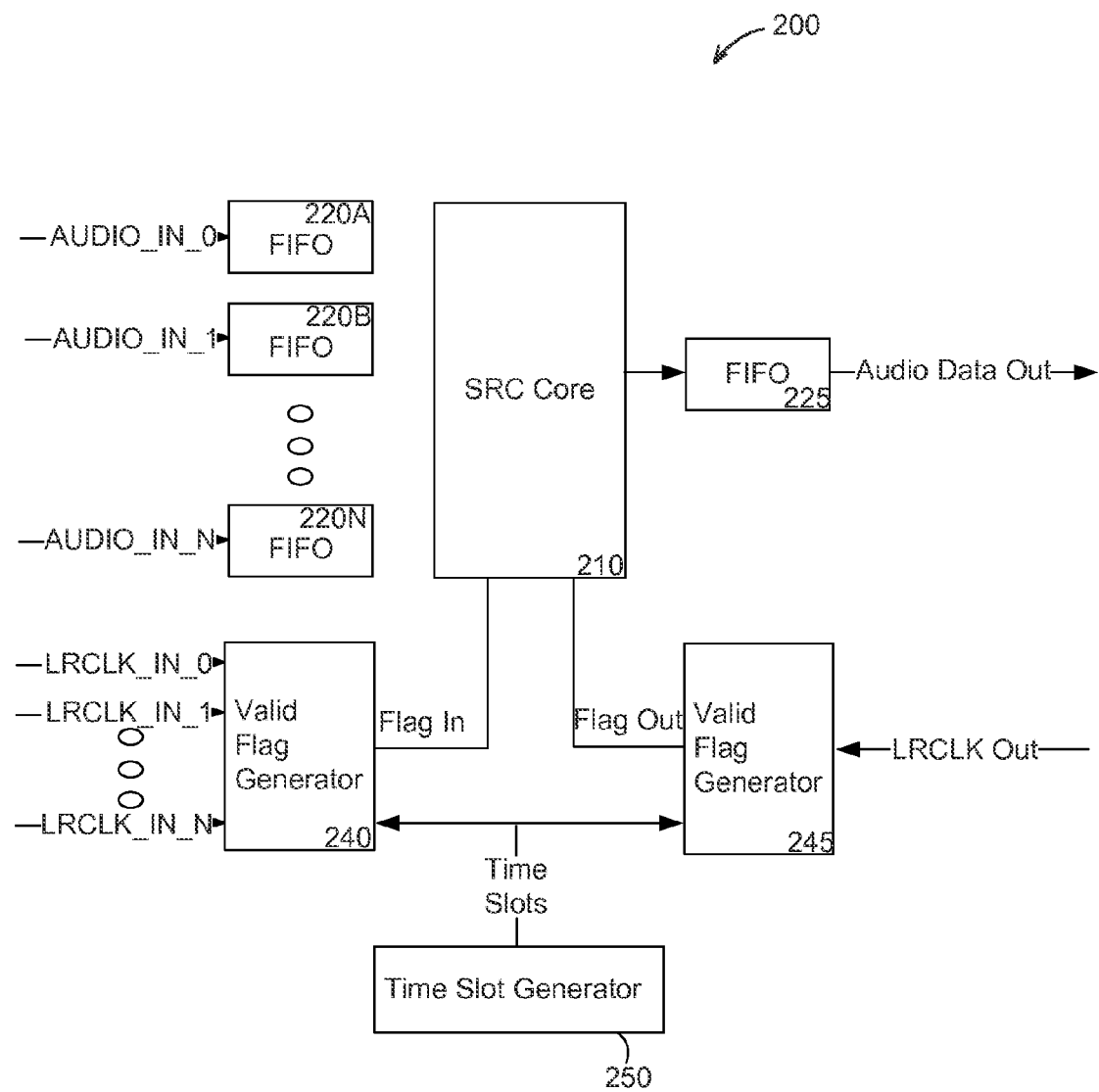
FIG. 7 is a schematic block diagram of an exemplary multi-channel sample rate converter.

Referring now to FIG. 7, there is illustrated a schematic block diagram of integrated multi-channel sample rate converter 200. IMCSRC 200 comprises a core processor 210, input buffers 220A to 220N, output buffer 225, an input flag generator 240, an output flag generator 245 and a time slot generator 250.

Time slot generator 250 is used to generate a free-running timing signal operating at the sample processing rate SRint. The sampling rate SRint is selected to be equal to or higher than the highest frequency input signal clock rate. For example, if the highest input signal sampling rate is LRCLK_IN_2 at 50 kHz, the sample processing rate SRint may be selected to be 60 kHz. In practice, the sample processing rate SRint can be predetermined and fixed based on the expected input signal sampling rates. If the input signals are known to be synchronous (i.e. all have the same sample rate), SRint can be simply selected to be the same rate as the input sample rate. In practice, the nominal input sample rate is usually known (e.g. 48 kHz), but the actual sample rate in transience can deviate from the nominal rate by as much as 12.5%. Accordingly, in such cases, SRint should be at least higher than the maximum transient sample rate among all channels.

The sample processing rate SRint has a corresponding sample processing period SPP, which is the reciprocal of sample processing rate (i.e., 1/SRint). For each sample processing period SPP, time slot generator 250 creates N time slots, where N is the number of input channels. Accordingly, the timing signal may indicate the start of each sample processing period or the start of each time slot within the period or both.

Figure 8A:
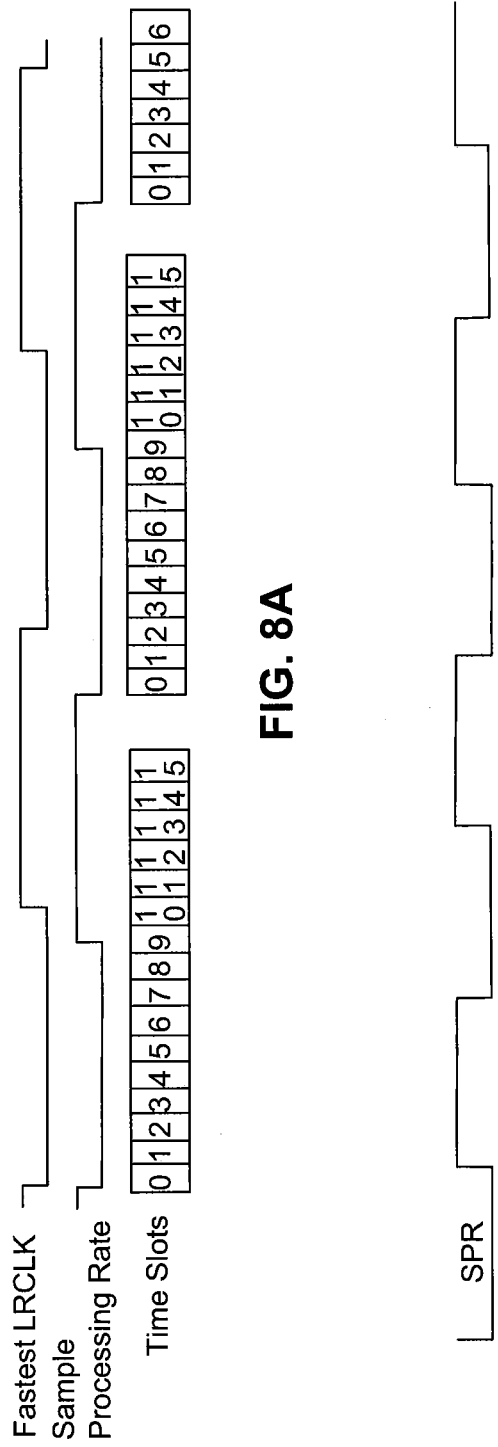
FIG. 8A is a time flow diagram showing sample clock periods and time slots.

Referring now to FIG. 8A, there is shown a time flow diagram illustrating several sample clock periods of input clock reference signal LRCLK_IN_4, along with corresponding periods of sample processing rate SRint and time slots generated by time slot generator 250. In the illustrated example, there are 16 input channels, and time slot generator 250 creates 16 time slots as shown in FIG. 8A. Sample processing rate SRint is slightly higher than the fastest input reference clock signal. The falling edge of sample processing rate SRint signal is used to trigger the start of the time slot for channel 0. Each time slot lasts a number of core processor clock cycles, to enable core processor 210 to perform the necessary processing for the sample in each time slot. Accordingly, the core processor frequency may be determined based on the sample processing rate SRint, the number of channels N to be processed, the frequency of each input signal, and the number of core processor clock cycles required to process each sample. In some embodiments, the core processor may process some samples in parallel, which may reduce the core processor frequency requirement.

Input buffers 220A, 220B to 220N periodically receive data samples for each input signal channel and buffer the signal data in a first in, first out (FIFO) fashion until the core processor 210 is ready to read the samples. An input buffer is provided for each input channel. Since the input signals may be asynchronous with respect to each other, each input buffer operates asynchronously to receive data samples as they arrive.

Input flag generator 240 monitors the reference clock signals LRCLK_IN_0 to LRCLK_IN_N for each input signal. Input flag generator 240 also receives the timing signal from time slot generator 250. For each reference clock signal, input flag generator 240 monitors the signal for a predetermined trigger. For example, the predetermined trigger may be the falling edge of the reference clock signal. Upon detecting the predetermined trigger, input flag generator 240 sets a valid flag for the channel to indicate that the next time slot for the channel will contain a valid sample of the input signal for that channel.

When the next time slot for the channel arrives, if the valid flag is set, input flag generator 240 sends a control signal to core processor 210 to notify core processor 210 that it may read a sample from the input buffer for the respective channel. As the sample processing rate is at a higher frequency than the input signal, a subset of time slots for the input signal may remain empty or invalid. If the internal sample rate is equal to that of the input signal, the valid flag may always be set.

Figure 8B:
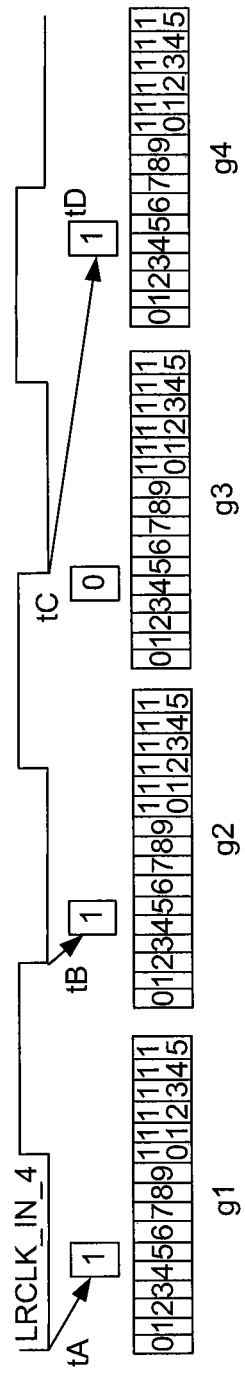
FIG. 8B is a time flow diagram of input flag generation for an input signal.

Referring now to FIG. 8B, there is shown a time flow diagram of input flag generation for input signal channel 4. Illustrated on a time axis are the timing signal, LRCLK_IN_4 and the time slots. Successive falling edges of LRCLK_IN_4 are shown at times tA, tB, tC and tD. Time slot groupings, corresponding to the period of the timing signal (i.e., SPRint), are illustrated as g1, g2, g3 and g4.

The first falling edge of LRCLK_IN_4 occurs prior to the time slot for channel 4 in grouping g1. Accordingly, a valid flag is set and the next time slot for channel 4 in grouping g1 will be filled with valid data when the time slot arrives. Likewise, the next falling edge at time tB occurs prior to the next time slot for channel 4 in grouping g2.

The subsequent falling edge of LRCLK_IN_4 occurs at time tC and a valid flag is set. However, the time slot for channel 4 in grouping g3 has already passed at time tC. Accordingly, since no valid flag was set for the time slot in grouping g3, it will not contain valid data. The next available time slot for channel 4 is in grouping g4 this time slot will be filled with valid data when it arrives.

Other methods of filling the time slots of the internal sampling rate signal may be used. In general, the average valid flag rate for an input channel should be the same as the sampling rate LRCLK for that channel.

Referring again to FIG. 7, core processor 210 is shown as receiving input signals via input buffers 220A to 220N. Core processor 210 also receives input flag and output flag signals from input flag generator 240 and output flag generator 245, respectively. An output signal is generated and sent to output buffer 225.

In an exemplary embodiment, core processor 210 is an application specific integrated circuit. In other embodiments, core processor 210 may be a programmable processor, such as a field programmable gate array, a general purpose digital signal processor or a general purpose microprocessor executing software program instructions. Core processor 210 is configured to receive one or more input samples for each input channel and compute output samples at the desired sample rate and synchronized to a desired reference clock.

Figure 9A:
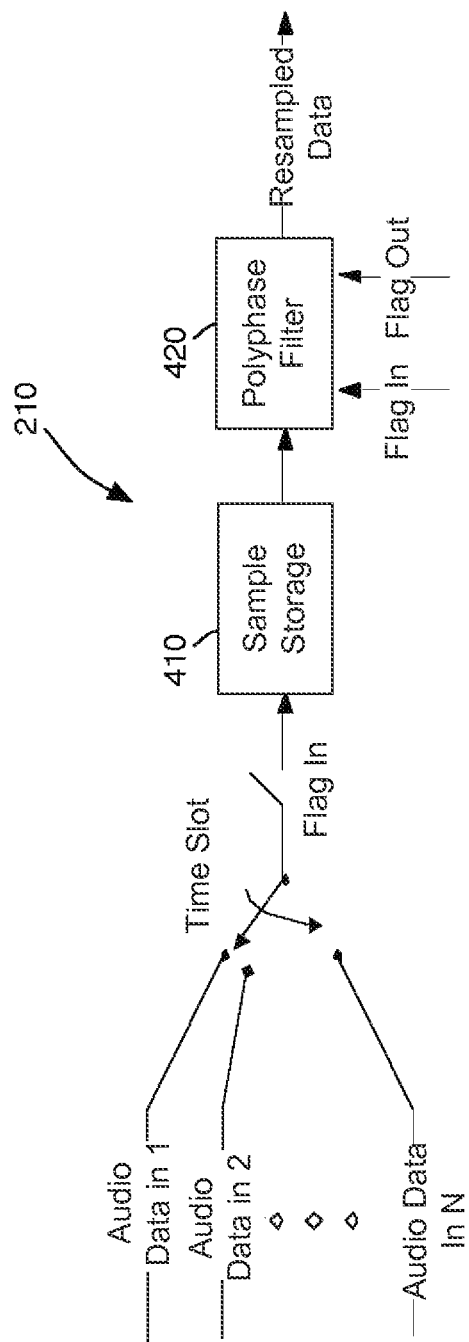
FIG. 9A is a simplified block diagram of a core processor.

Referring now to FIG. 9A, these is shown a simplified block diagram of core processor 210. Core processor 210 comprises sample storage 410 and filter 420. Filter 420 may be a polyphase filter. In an exemplary embodiment, filter 420 is a multi-stage polyphase filter.

A polyphase filter generally requires at least M+1 samples to be readily available from a channel when calculating an output sample value for that channel. Accordingly, a sample storage 410, such as a random access memory, is provided to supply data samples to polyphase filter when needed.

In operation, core processor 210 is operable to sequentially read input samples from each input channel. If the valid flag for the respective channel is set, the data sample is stored in sample storage 410. In at least one embodiment, polyphase filter 420 is also triggered by the input valid flag to read the most recently stored sample from sample storage 410 to perform first stage filtering. Polyphase filter 420 may also read additional recently stored samples for use in filtering.

Upon completion of a filtering stage, polyphase filter 420 may also store one or more newly computed sample values in sample storage 410.

Figure 9B:
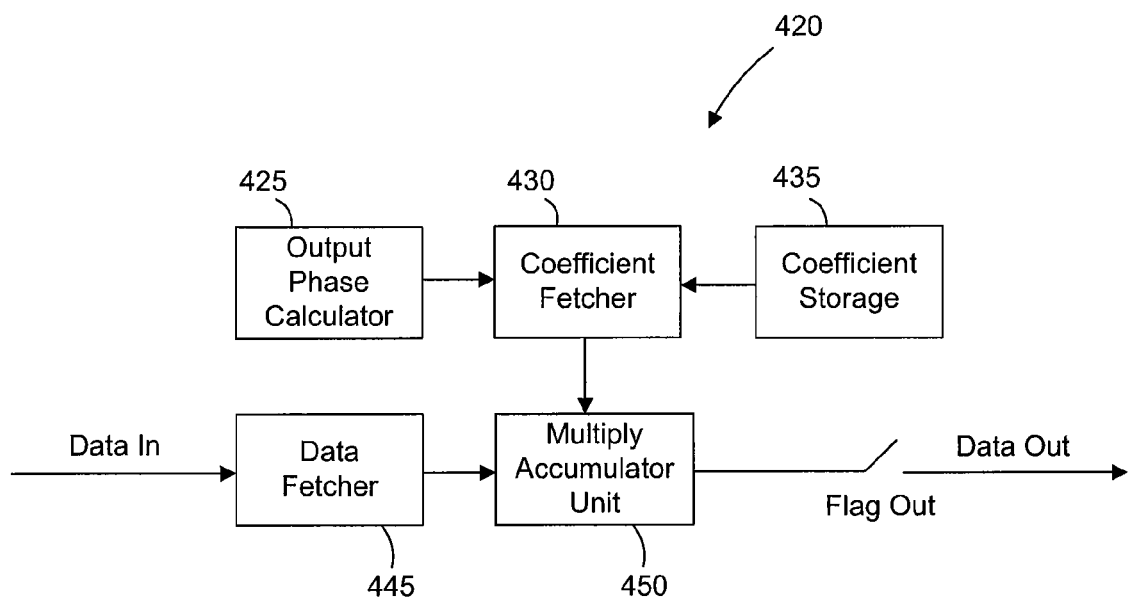
FIG. 9B is a simplified block diagram of a polyphase filter.

Referring now to FIG. 9B, there is shown a simplified block diagram of polyphase filter 420. Polyphase filter 420 comprises a data fetcher 445, a multiply accumulator (MAC) unit 450, an output phase calculator 425, a coefficient fetcher 430 and coefficient storage 435.

In operation, data fetcher 445 reads one or more input data samples and feeds these to MAC unit 450. MAC unit 450 multiplies the input data samples fetched from sample storage 410 with the coefficients fetched from coefficient storage 435 by coefficient fetcher 430. The product of the multiplication is accumulated within the MAC unit. The accumulator is cleared at the start of each time slot.

To achieve high-quality resampling using a single stage polyphase filter, a large filter order is typically required. Such a filter may require a relatively large number of clock cycles to compute each sample value, thus requiring longer time slots. Longer time slots correspond to fewer channels for a given internal sampling rate.

In order to increase the channel capacity at a given resampling quality level and processing speed, the polyphase filter can be designed to have multiple cascading stages.

In embodiments with a multi-stage polyphase filter, the initial stages of filtering may be performed when an input flag is received. In contrast, later stages of filtering may be performed when an output flag is received, and the result provided as output immediately upon completion of the filtering operation.

Figure 9C:
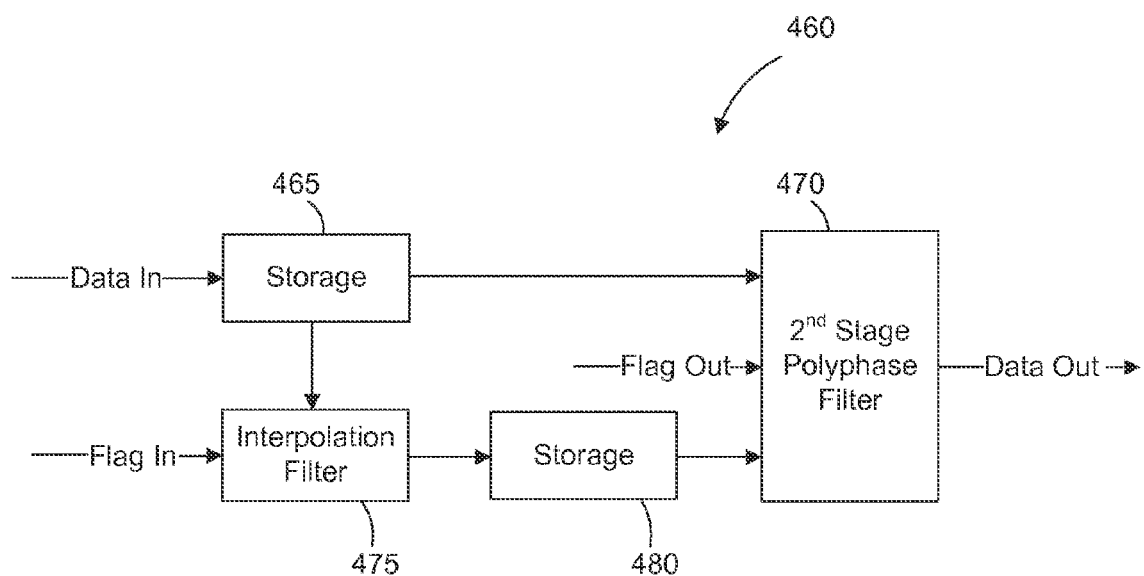
FIG. 9C is a simplified block diagram of an exemplary two stage polyphase filter.

Referring now to FIG. 9C, an exemplary two stage polyphase filter 460 is shown. Two stage polyphase filter 460 comprises sample storage 465, which is operatively connected to a first stage interpolation filter 475 and the second stage polyphase filter 470. A second sample storage 480 is also provided, which stores samples from interpolation filter 475 for use by second stage polyphase filter 470.

Figure 8C:
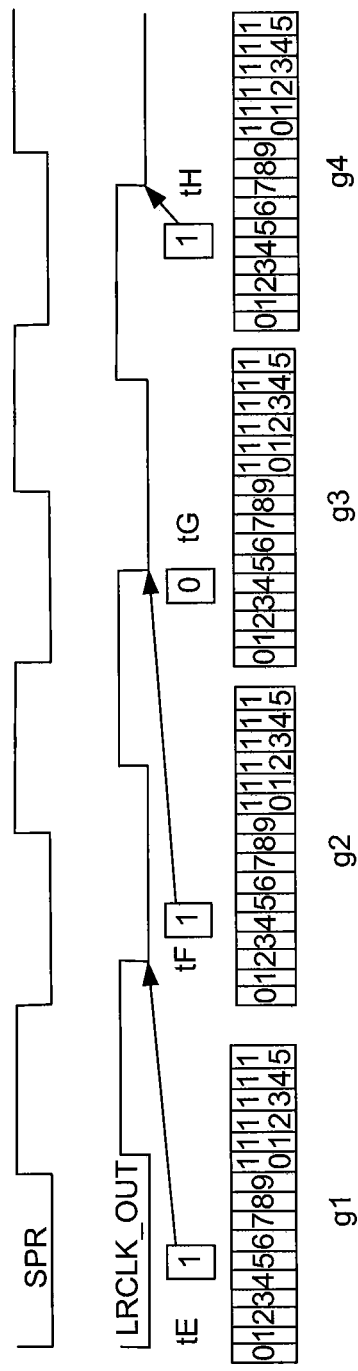
FIG. 8C is a time flow diagram of output flag generation for an output signal.

Referring now to FIG. 8C, there is shown a time diagram of output flag generation for input signal channel 4. Illustrated on a time axis are the internal sampling signal SPRint, the output timing signal LRCLK_OUT and the time slots. Successive falling edges of LRCLK_OUT are shown at times tE, tF, tG and tH. Time slot groupings, corresponding to the period of the timing signal (i.e., SPRint), are illustrated as g5, g6, g7 and g8.

The first falling edge of LRCLK_OUT occurs prior to the time slot for channel 4 in grouping g5. Accordingly, a valid output flag is set and the data sample for channel 4 from the g5 grouping will be used to form the output signal. Likewise, the next falling edge of LRCLK_OUT at time tF occurs prior to the next time slot for channel 4 in grouping g6. Accordingly, the data sample in the g6 grouping will also be used.

However, the subsequent falling edge of LRCLK_OUT occurs at time tG. A valid output flag is set. However, the time slot for channel 4 in grouping g7 has already passed. Accordingly, since no valid flag was set for the time slot in grouping g7, the data sample for channel 4 in grouping g7 will be discarded or omitted. The next available time slot for channel 4 is in grouping g8, and the data sample in this time slot will be used to form the output data signal. In this manner, output samples for each channel may be synchronized or mapped to the output signal.

If required, the output data samples that are produced can be arranged to pass through an output buffer 225. Output buffer 225 receives data samples for each output signal channel and buffers the signal data in a first in, first out (FIFO) fashion. Accordingly, the buffered signal data may be read from the output buffer 225 in a steady pace at the LRCLK_OUT frequency. In some embodiments, output buffer 225 may comprise a plurality of parallel buffers corresponding to the number of output channels. In other embodiments, output buffer 225 may be designed to buffer multiplexed signal data.

Coefficient fetcher 430 reads coefficients from coefficient storage 435 based on the output phase offset for each output sample, as calculated by output phase calculator 425. That is, the coefficients are fetched according to the output sample phase offset. The output sample phase offset may be calculated from the ratio of the input signal sampling rate and the output signal sampling rate. For example, $R$=LRCLK-in-rate/LRCLK-out-rate Phase offset for the output sample 0=0

Phase offset for the output sample 1=((fraction of $R$)* (total number of phases))

Phase offset for the output sample $n$=((fraction of (phase for the output sample $n$−1)+$r$)*(total number of phase offsets))

There are other means for generating output phases. For example, the phase offset for an output sample n' may be determined as follows:

Phase offset for output sample $n'$=(fraction of $n'*R$)* (total number of phase offsets)

In an exemplary embodiment, a two stage polyphase filter is employed to resample signal data. The first stage performs 2× interpolation and the second stage performs 256× interpolation, for a combined 512× interpolation filter. A further linear interpolation unit is provided for generating output samples that fall between two of the 512 interpolation phase offsets. An exemplary two stage polyphase filter 460 is shown in FIG. 9C.

In operation, core processor 210 reads a new data sample upon receiving an input flag. The first stage 2× interpolation filter is applied to generate an interpolated sample value that falls in the middle of the two neighboring samples in the original signal data. Both the new samples and the original samples may be stored in sample storage 410 to be fetched by the second stage filter when required. In some embodiments, the new sample may be stored in a different sample memory (not shown).

Upon receiving an output flag, core processor 210 determines the output sampling point and derives the phase offsets for the neighboring sample points that will be present in the upsampled intermediate signal. Based on the derived phase offsets, data fetcher 445 reads the corresponding sample data from sample storage 410. Output phase calculator 425 determines the required filter coefficients for the output sample phase offset and instructs coefficient fetcher 430 to retrieve the required filter coefficients from coefficient storage 435. The filter coefficients are used to process the retrieved samples in MAC 450 to generate the resulting sample values for the neighboring sample points. If the output sample point falls between the neighboring sample points, linear interpolation can be performed to generate the output sample value. In some other embodiments, linear interpolation may be performed between the two sets of coefficients that correspond to the two adjacent sampling points. The interpolated coefficients may then be used to process the retrieved samples in MAC 450.

The output sampling point may be obtained by detecting the rising or falling edges of the output clock reference signal relative to the input sample points. However, this approach is subject to jitter in the high speed clock that is used for edge detection, as the jitter will be translated into noise in the output signal.

An alternative approach is to average the input clock period and the output clock period and calculate the ratio between them. The ratio is equivalent to the output sample rate normalized with regard to input sample rate. By accumulating the ratio each time, a new output sampling point may be obtained.

In some embodiments, there may be more than one output reference clock signal. In such embodiments, the SRC can resample an input signal to produce an output signal that is locked to a selected output reference signal.

Figure 10:
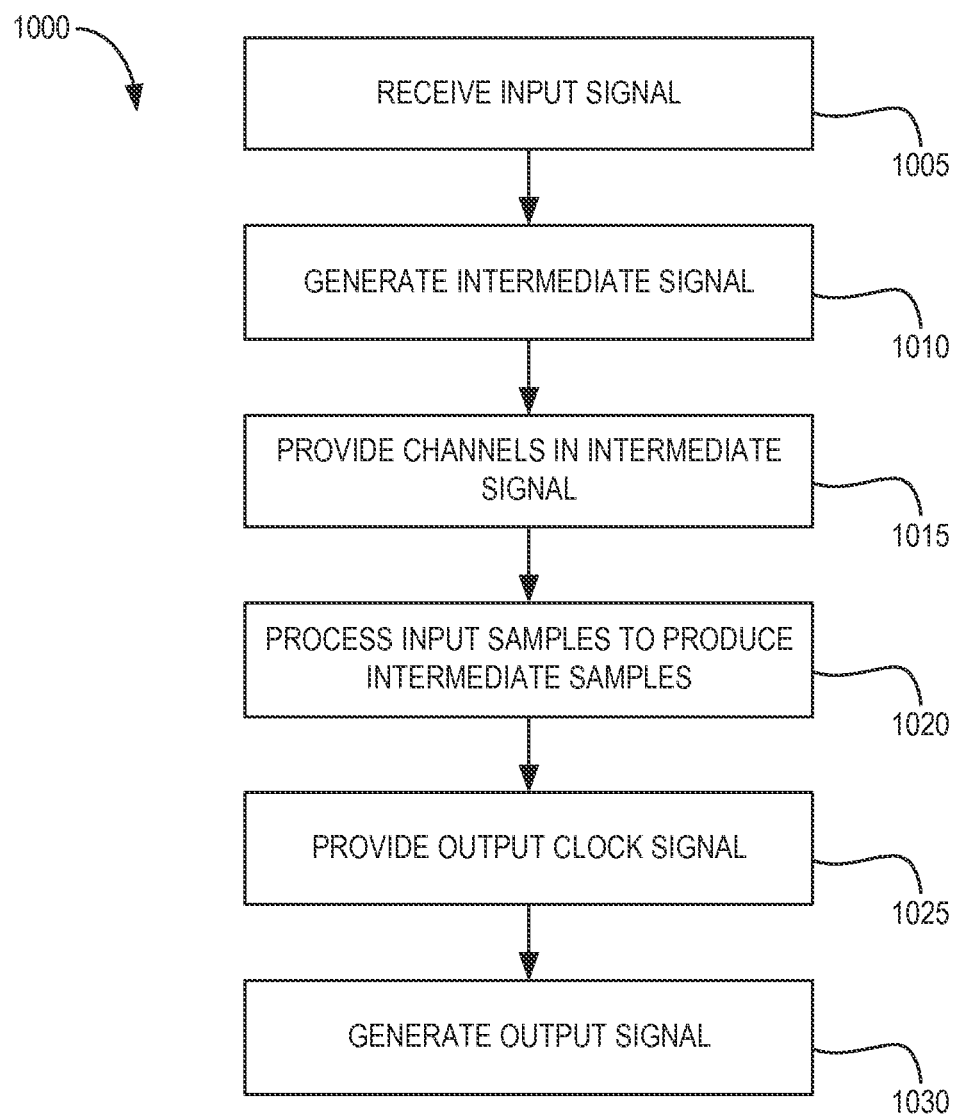
FIG. 10 illustrates a sample method of sample rate conversion.

Referring now to FIG. 10, there is illustrated an example method 1000 of sample rate conversion for at least one input signal, each at least one input signal having a plurality of input samples, the method comprising: receiving 1005 the at least one input signal, generating an intermediate signal 1010 with an intermediate clock rate that is higher than or equal to each at least one input signal; providing N channels in the intermediate signal 1015, wherein N is an integer value corresponding to the number of input signals, and wherein each of the N channels corresponds to one and only one input signal; for each at least one input signal, processing 1020 each of the plurality of input samples in the at least one input signal to produce a plurality of intermediate samples for the corresponding channel; providing an output reference clock signal 1025; and generating N output signals 1030 synchronized to the output reference clock signal, each output signal corresponding to one channel in the intermediate signal, wherein each output signal is generated by filtering the plurality of intermediate samples corresponding to each channel to produce a plurality of output samples in the corresponding output signal.

The present embodiments have been described here by way of example only. Various modification and variations may be made to these exemplary embodiments without departing from the spirit and scope of the invention, which is limited only by the appended claims.

The invention claimed is:

1. A method of sample rate conversion for at least one input signal, each at least one input signal having a plurality of input samples, comprising:

receiving the at least one input signal;

generating an intermediate signal with an intermediate clock rate that is higher than or equal to each at least one input signal;

providing N channels in the intermediate signal, wherein N is an integer value corresponding to the number of input signals, and wherein each of the N channels corresponds to one and only one input signal;

for each at least one input signal, processing each of the plurality of input samples in the at least one input signal to produce a plurality of intermediate samples for the corresponding channel;

providing an output reference clock signal; and generating N output signals synchronized to the output reference clock signal, each output signal corresponding to one channel in the intermediate signal, wherein each output signal is generated by filtering the plurality of intermediate samples corresponding to each channel to produce a plurality of output samples in the corresponding output signal, wherein the at least one input signal comprises a plurality of input signals, and wherein the N channels in the intermediate signal are provided by multiplexing the intermediate signal to accommodate the plurality of input signals, and wherein the multiplexing comprises dividing each clock period of the intermediate signal into N time slots.

2. The method of claim 1, wherein processing the plurality of input samples comprises at least one first stage of filtering of the plurality of input samples.

3. The method of claim 1, wherein filtering the plurality of intermediate samples comprises interpolation between the plurality of intermediate samples.

4. The method of claim 1, wherein filtering the plurality of intermediate samples comprises upsampling the plurality of intermediate samples.

5. The method of claim 1, wherein, prior to the processing each of the plurality of input samples in the at least one input signal, each of the input samples is matched to a corresponding period of the intermediate signal based on a predetermined transition in a clock associated with the at least one input signal.

6. The method of claim 1, wherein, prior to the producing the plurality of output samples, each of the intermediate samples is matched to a corresponding period of the output signal based on a predetermined transition in the output reference clock signal.

7. The method of claim 2, wherein the at least one first stage of filtering comprises interpolation between the plurality of input samples.

8. The method of claim 2, wherein the at least one first stage of filtering comprises upsampling the plurality of input samples.

* * * * *